US006935768B2

United States Patent
Löwe et al.

(10) Patent No.: US 6,935,768 B2
(45) Date of Patent: Aug. 30, 2005

(54) METHOD AND STATISTICAL MICROMIXER FOR MIXING AT LEAST TWO LIQUIDS

(75) Inventors: Holger Löwe, Oppenheim (DE); Jörg Schiewe, Mainz-Hechtsheim (DE); Volker Hessel, Hünstetten-Wallbach (DE); Thomas Dietrich, Frankfurt am Main (DE); Andreas Freitag, Frankfurt am Main (DE)

(73) Assignees: Institut fur Mikrotechnik Mainz GmbH (DE); Mikroglas Chemtech GmbH (DE)

( * ) Notice: Subject to any disclaimer, the term of this patent is extended or adjusted under 35 U.S.C. 154(b) by 185 days.

(21) Appl. No.: 10/344,717
(22) PCT Filed: Aug. 23, 2001
(86) PCT No.: PCT/EP01/09728
    § 371 (c)(1),
    (2), (4) Date: Jul. 28, 2003
(87) PCT Pub. No.: WO02/16017
    PCT Pub. Date: Feb. 28, 2002

(65) Prior Publication Data
    US 2004/0027915 A1 Feb. 12, 2004

(30) Foreign Application Priority Data
    Aug. 25, 2000 (DE) .......................... 100 41 823

(51) Int. Cl.$^7$ .............. B81B 1/00; B01F 5/04
(52) U.S. Cl. ............... 366/167.1; 366/341; 366/DIG. 3
(58) Field of Search ............... 366/341, 338, 366/173.1, 172.1, 167.1; 422/100, 99

(56) References Cited

U.S. PATENT DOCUMENTS

| | | | | |
|---|---|---|---|---|
| 4,534,659 A | * | 8/1985 | Dourdeville et al. | 366/338 |
| 6,065,864 A | * | 5/2000 | Evans et al. | 366/167.1 |
| 6,296,020 B1 | * | 10/2001 | McNeely et al. | 366/DIG. 3 |
| 6,655,829 B1 | * | 12/2003 | Vanden Bussche et al. | 366/165.1 |

FOREIGN PATENT DOCUMENTS

| | | |
|---|---|---|
| DE | 195 41 266 | 5/1997 |
| DE | 198 16 886 | 10/1999 |
| EP | 0 903 174 | 3/1999 |
| EP | 0 928 785 | 7/1999 |

OTHER PUBLICATIONS

Microreactors, W. Ehrfeld, V Hessel, and H. Lowe, 2000, Wiley–VCH, Germany XP002190806, pp. 44–46 and 80–83.
Novel Liquid Phase Microreactors for Safe Production of Hazardous Specialty Chemicals, T Floyd, M. Losey, S. Firebaugh, K. Jensen, and M. Schmidt, 2000, Springer–Verlag Berlin Heidelberg, Germany, pp. 171–179.

* cited by examiner

Primary Examiner—Tony G. Soohoo
(74) Attorney, Agent, or Firm—Hudak, Shunk & Farine Co. LPA

(57) ABSTRACT

The invention relates to a procedure and a micromixer for mixing at least two fluids. The aim of the invention is to reduce the mixing time of the micromixer compared to micromixers known to the art while maintaining high mixing quality and small structural dimensions. The inventive procedure is characterized by the following steps: a plurality of separated fluid currents of both fluids are brought together and alternately adjacent fluid lamellae of both fluids are formed: the combined fluid currents are carried away and a focused total fluid current is formed; the focused total fluid current is fed as fluid jet into an expansion chamber; and the resulting mixture is drawn off. The micromixer comprises a plurality of alternately adjacent fluid channels which open into an inlet chamber. A focusing channel is in fluid connection with said inlet chamber and opens into an expansion chamber. The inventive procedure and micromixer are especially advantageous in that they are suitable for the production of emulsions and dispersions.

23 Claims, 7 Drawing Sheets

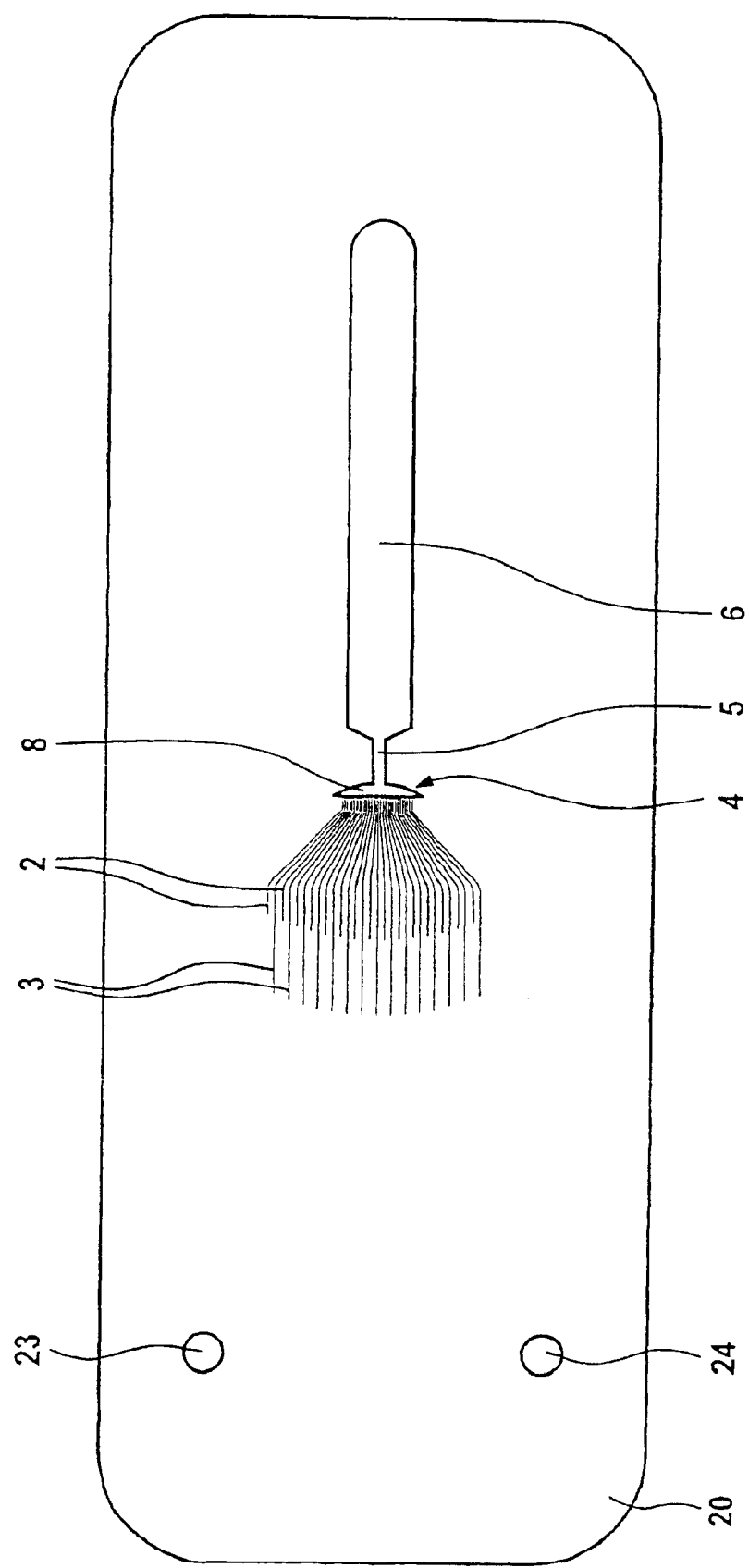

METHOD AND STATISTICAL MICROMIXER FOR MIXING AT LEAST TWO LIQUIDS

DESCRIPTION

The invention relates to a procedure and a static micromixer for mixing at least two fluids.

When mixing at least two fluids, the goal is to achieve an even distribution of the two fluids within a particular time period, in general the briefest possible period. For this purpose, mixing processes with a high specific application of energy are desirable. Advantageous are mixing processes with directed currents, which make the actual mixing processes foreseeable by using models. It is particularly advantageous for this purpose to use static micromixers like the ones described in the overview by W. Ehrfeld, V. Hessel, H. Löwe in Microreactors, New Technology for Modern Chemistry, Wiley-VCH 2000, pages 41 to 85. With static micromixers known to the art, mixing times of between 1 s and few milliseconds are obtained by generating alternately adjacent fluid lamellae with a thickness in the μm range. In contrast to dynamic mixers wherein turbulent flow conditions are prevailing, the given geometry allows an exact adjustment of the width of the fluid lamellae and thus of the diffusion paths. The very narrow distribution of the mixing times achieved hereby gives room to multiple possibilities of optimizing chemical reactions with regard to selectivity and yield. An additional advantage of the static micromixer is the miniaturization and thereby the capability of integration into other systems, such as heat exchangers and reactors. Potential applications are fluid/fluid and gas/gas mixtures, including reactions in the corresponding regimes, as well as fluid/fluid emulsions, gas/fluid dispersions, solid/fluid dispersions, and thus also multiphase and phase transfer reactions, extractions, and absorption.

A static micromixer based on the principle of multi-lamination has on one plane a micro-structured interdigital structure of intermeshing channels with a width of 25 μm or 40 μm (ibid, pages 64 to 73). The channels divide the two fluids to be mixed into a multitude of separate fluid currents configured to flow parallel to one another in opposite directions and alternating with one another. The adjacent fluid currents are carried vertically from the plane upward through a slot and brought into contact with one another. The possibility of reducing the channel geometry and thus the fluid lamellae width down to the lower pm range by structuring procedures suitable for mass production is limited.

An additional reduction of the fluid lamellae generated by the multi-lamination principle can be achieved by so-called hydrodynamic focusing. A static micromixer of this type for converting hazardous materials is presented by T. M. Floyd et al. on pages 171 to 179 in Microreaction Technology: Industrial Prospects; Proceedings of the Third International Conference on Microreaction Technology/IMRET3, editor: W. Ehrfeld, Springer 2000. Alternately adjacent channels for the two fluids to be mixed run in a semicircle and enter radially from the outside into a chamber stretched into funnel shape which then opens into a narrow, long channel. The fluid lamellae current combined in the chamber is thereby transferred into the narrow channel, which causes the fluid lamellae width to be reduced. With reduced lamellae widths in the lower pm range, as well, diffusion-related mixing times in millisecond range are obtained, which is still too long for some applications, in particular, for ultra-fast reactions. Furthermore, due to the long channel functioning as reaction space, this micromixer has large dimensions.

The invention relates to the object of creating a procedure and a static micromixer for mixing at least two fluids in order to make quick mixing of the fluids possible while obtaining high mixing quality and providing a device with small dimensions.

The object is achieved according to the invention by a procedure and a static micromixer according to the claims.

Hereinafter, the term of fluid will be understood as a gaseous or liquid substance or a mixture of substances of this kind which may contain one or several solid, liquid, or gaseous substances in dissolved or dispersed state.

The term of mixing comprises also the processes of dissolving (blending), dispersing, emulsifying, and suspending. As a consequence, the term of mixture comprises solutions, fluid/fluid emulsions, gas/fluid, and solid/fluid dispersions.

The term of a multitude of fluid currents or fluid channels is understood as two or more, preferably three or more, particularly preferably five or more, fluid currents or fluid channels. For two fluids A, B, alternately adjacent fluid lamellae or fluid channels mean that these run alternately adjacent, generating a sequence of ABAB, on at least one plane. For three fluids, A, B, C, the term of "alternately adjacent" comprises differing sequences, as for example, ABCABC or ABACABAC. The fluid lamellae or fluid channels can also run alternately adjacent on more than one plane, as for example, in two dimensions offset chessboard-like in relation to one another. The fluid currents and fluid channels corresponding to the different fluids are preferably running in the same or in opposite directions, parallel to one another.

The procedure according to the invention for mixing at least two fluids comprises at least four steps: in the first step, a multitude of separate fluid currents of the two fluids, each of a width in the range of 1 μm to 1 mm and of a depth in the range of 10 μm to 10 mm, are brought together and alternately adjacent fluid lamellae of the two fluids are generated. In the second step, the fluid currents combined in this way are carried away and formed into a focused total fluid current. In the third step, the resulting total fluid current, as fluid jet, is fed into an expansion chamber having a larger cross section in comparison to the focused total fluid current perpendicular to the flowing direction of the focused total fluid current. In the final step, the resulting mixture is drawn off.

The currents are brought together in such a way that the fluid currents, which at first are separate, flow into one space. In this process, the fluid currents may run parallel, or run into one another, for example, radially inward. When the currents are brought together, fluid lamellae are generated the cross sections of which at first correspond to those of the fluid currents. By carrying off the fluid currents as focused total fluid current, the width and/or cross section of the fluid lamellae are reduced, while at the same time, the flow velocity is increased. The resulting accelerated focused total fluid current is fed into the expansion chamber as fluid jet. The broadening of the fluid lamellae in the expansion chamber causes forces (shearing forces) to arise perpendicular to the main flow direction which permit shorter mixing times to be obtained in comparison to solely diffusive mixing. In particular, the process of fragmentation into individual particles as discontinuous phase within a continuous phase and thereby the generation of emulsions and dispersions is advantageously influenced. A particular advantage in this context is the effect of the fluid jet as suction and carrier jet as well as the occurrence of directed vortices.

Preferably, the combined fluid currents are focused in such a way that the ratio between the cross section of the focused total fluid current and the sum of the cross sections of the fluid currents to be combined, always perpendicular to the flow direction, is in the range of 1 to 1.5 through 1 to 500, preferably in the range of 1 to 2 through 1 to 50. The smaller the ratio, the more the lamellae width is reduced and the more the flow velocity is increased at which the focused total fluid current is fed into the expansion chamber as fluid jet. Advantageously, the cross section of the focused total fluid current remains constant over its length. It is also conceivable to provide a cross section which decreases in direction of the expansion chamber, while the above ratio remains in effect for the range with the smallest cross section.

Preferably, the ratio between the length of the focused total fluid current and its width is in the range of 1 to 1 through 30 to 1, preferably in the range of 1.5 to 1 through 10 to 1. In this context, the focused total fluid current is to be, as far as possible, sufficiently long to enforce a sufficient focusing effect while retaining the laminar flow conditions. However, in the interest of brief mixing times, the focused total fluid current should be designed to be short in order to permit the fluid jet to be fed into the expansion chamber as fast as possible.

Advantageously, the focused total fluid current is fed into the expansion chamber as fluid jet in such a way that vortices, in particular, stationary vortices are generated at least on one plane, preferably on both sides of the fluid jet. Stationary vortices of this type are generated, in particular, in the areas along which the fluid jet passes, thereby causing these areas to rotate. Preferably, the fluid jet is fed into the space symmetrically so that stationary vortices are generated at least on one plane on both sides. If the expansion chamber is broadened not only with regard to width, but also over the entire cross section in comparison to the focused total fluid current, it is particularly advantageous to have stationary vortices generated on all sides around the fluid jet. The shearing forces arising in the stationary vortices with at least partially turbulent flow conditions have a positive effect on the mixing process. Advantageously, the expansion chamber is constructed in such a way that the vortices are not generated in so-called still water zones, but in flow-through areas.

According to one embodiment, after the fluid current has been fed into the expansion chamber, at least one part of the fluid current is again drawn off and focused. This may involve the entire fluid jet leaving the expansion chamber, or only a part thereof, while the other part is advantageously drawn off as finished mixture. One advantage obtained by the re-focusing process is the fact that additional areas which have not yet been completely mixed are brought into contact. In this case, the focused fluid current is advantageously again fed into an additional expansion chamber as fluid jet and vortices are generated.

According to a further embodiment, the following steps are repeated once or several times. In the first of the said steps, at least part of the fluid current, after previously having been fed into the expansion chamber, is formed into a focused fluid current and carried away. In the second step, the focused fluid current is fed into a further expansion chamber which has a larger cross section than the focused fluid current perpendicular to the flow direction of the focused fluid current. After these steps have been executed once or several times, the resulting mixture is drawn off. Due to the repeated processes of focusing and feeding into an expansion chamber, a particularly intensive mixing action is achieved, which is advantageous, in particular, for the generation of emulsions and dispersions with small particle sizes. For the advantageous execution of the focusing and feeding processes, please refer to the preferred embodiments listed.

Advantageously, an additional fluid is fed into the expansion chamber. This additional fluid may be fed in at one or several points which preferably are disposed symmetrically to the fluid jet. The additional fluid may contain an additive for stabilizing the mixture, as for example, an emulsifier.

Advantageously, at least one part of the resulting mixture is drawn out of the area or areas of the expansion chamber while vortices are being generated. In this context, the resulting mixture may be drawn off in one or several currents which preferably are arranged symmetrically to the fluid jet. In this context, it is particularly advantageous to draw the fluid from the areas of the stationary vortices in which the mixture is of high mixing quality.

According to a preferred embodiment, the focused total fluid current is directed to a structure which is located in the expansion chamber and deflects the fluid jet. This deflector structure may be a flat or a bowed surface or a structure for deflecting and/or splitting the fluid jet. Equally, the wall of the expansion chamber opposite the point at which the focusing channel enters may be constructed in such a way that it serves as deflector structure. With this embodiment, a pre-laminated and focused total fluid current is used and extremely high specific energy densities and thus a high degree of turbulence are obtained. This strong turbulence leads to the generation of small vortices, which in turn leads to very small particle diameters, for example, droplet diameters in emulsions, due to the arising strong shearing forces. In contrast to procedures known to the art, a generation of preliminary emulsions is not required.

According to a further embodiment, the first two steps are executed twice or several times simultaneously and spatially separately. This accordingly causes two or several focused total fluid currents to be obtained which are then fed into a common expansion chamber. In this context, it is particularly advantageous to feed the focused total fluid currents as fluid jet into the common expansion chamber in such a way that they meet, i.e. that they collide. The total fluid currents to be fed in can contain the same fluids or differing fluids which are not mixed until they reach the common space and make contact. Here, as described before, additional steps, such as renewed focusing and feeding as fluid jet into an expansion chamber, may follow. As with the preceding embodiment using a deflector structure, extremely high specific energy densities and thus a high degree of turbulence are obtained when using two or several pre-laminated and focused total fluid currents; which causes the generation of very small particle diameters, particularly with suspensions, dispersions, and emulsions.

The static micromixer according to the invention for mixing at least two fluids comprises a multitude of alternately adjacent fluid channels, an inlet chamber, a focusing channel, an expansion chamber, and an outlet channel for drawing off the resulting mixture. The multitude of alternately adjacent fluid channels has a width in the range of 1 $\mu$m to 1 mm and a depth in the range of 10 $\mu$m to 10 mm for the separate supply of the fluids as fluid currents. The inlet chamber into which the fluid channels enter serves to combine the multitude of separate fluid currents of the two fluids. The focusing channel is fluidly connected to the inlet chamber in order to carry away the fluid currents combined in the inlet chamber and form a focused total fluid current. The expansion chamber into which the focusing channel runs and into which the focused fluid current enters as fluid jet has a larger cross section than the focusing channel perpendicular to the axis of the focusing channel. The at least one outlet channel fluidly connected to the expansion chamber serves the purpose of drawing off the resulting mixture.

Preferably, the inlet chamber has in its interior a concave or semi-concave shape on at least one plane, while the concave surface to the center of which the focusing channel runs is disposed opposite the surface into which the fluid channels run. Due to the concave shape, it is possible to quickly bring the currents together and carry them off into the focusing channel while fluid lamellae are being generated. However, it is also conceivable to carry the combined fluid currents gradually in the direction of the focusing channel, for which process the inlet chamber is constructed in a way to stretch into a V-shape or funnel shape on at least one plane.

In the interest of simple technical implementation, it is advantageous to design the fluid channels, the inlet chamber, the focusing channel and/or the expansion chamber with the same depth. In this context, it is also advantageous to arrange the points where the fluid channels enter on one plane, at least in the area of the inlet chamber.

Preferably, the focusing channel is constructed in such a way that the ratio between the cross section of the focusing channel and the sum of the cross sections of the fluid channels entering into the inlet chamber, always perpendicular to the respective channel axis, is in the range of 1 to 1.5 through 1 to 500, preferably, in the range of 1 to 2 through 1 to 50. Thereby, an additional reduction of the lamellae width and/or the cross section in comparison to the given width of the fluid channels is achieved, and combined with this, an increase in the flow velocity. Advantageously, the cross section of the focusing channel remains essentially constant over its entire length. It is also conceivable that the cross section of the focusing channel decreases in direction of the expansion chamber and that the above ratio of the cross sections is applicable for the area with the smallest cross section.

Preferably, the ratio between the length of the focusing channel and its width is in the range of 1 to 1 through 30 to 1, preferably in the range of 1.5 to 1 through 10 to 1. In this context the length of the focusing channel is advantageously selected in such a way that focusing on high flow velocity while generating the fluid lamellae is achieved and that in the interest of fast mixing, the fluid current is fed quickly into the expansion chamber.

According to one embodiment, the expansion chamber is constructed as a channel with a wider cross section than the focusing channel and follows the latter in longitudinal direction.

Preferably, the ratio between the cross section of the expansion chamber and the cross section of the focusing channel entering into the expansion chamber, perpendicular to the channel axis, is in at least a central area in the range of 1.5 to 1 through 500 to 1, preferably in the range of 2 to 1 through 50 to 1. Due to the broadening in the transitional area between the focusing channel and the expansion chamber, the focused total fluid current is fed into the expansion chamber as fluid jet, during which process forces arise perpendicular to the fluid jet which promote fast mixing. These cross-acting forces promote the process of the fragmentation of the fluid lamellae into individual particles, particularly during the formation of emulsions and dispersions. Depending on the design of the expansion chamber, vortices which change in time or are stationary are generated laterally to the fluid jet while it is being injected. It is advantageous for the expansion chamber to have its interior shaped, on at least one plane, in a way suitable for the generation of stationary vortices. This makes it possible to avoid still water zones so that the fluid constantly flows through all areas of the expansion chamber.

According to one embodiment, the expansion chamber opens into an additional focusing channel serving as outlet channel. This channel serves the purpose of drawing off and refocusing at least part of the total fluid current. Advantageously, the additional focusing channel follows the first focusing channel entering into the expansion chamber in longitudinal direction, in order to catch at least part of the fluid jet entering into the expansion chamber.

A further embodiment of the static micromixer is equipped with a series of one or several additional focusing channels into which opens the respective previous expansion chamber, as well as a series of one or several expansion chambers. The additional focusing channels serve the purpose of drawing off and focusing at least part of the total fluid current and enter into the respective subsequent additional expansion chamber. An outlet channel fluidly connected with the last expansion chamber in the series serves to draw off the resulting mixture. Static micromixers of this type with focusing channels and expansion chambers arranged in series are particularly advantageously suited for the production of emulsions and dispersions with tight particle size distribution. Advantageously, the cross section of the additional focusing channel is smaller than or equal to the cross section of the preceding focusing channel.

According to a further embodiment, one or several supply channels enter into the expansion chamber or the additional expansion chambers in order to supply an additional fluid. Fluids of this type can contain an additive for stabilizing the mixture, as for example, an emulsifier. The supply channels are advantageously disposed symmetrically in relation to a plane on which the axis of the focusing channel lies.

According to a further embodiment, the expansion chamber has one or several outlet channels connected thereto in order to draw off the resulting mixture. The outlet channels are preferably located in the areas in which stationary vortices are generated. Here as well, the outlet channels are advantageously disposed symmetrically in relation to a plane on which the axis of the focusing channel lies.

Advantageously, the expansion chamber is configured with a structure in such a way that the fluid jet is directed to this structure and deflected. This deflector structure may have a flat or bowed surface or a structure for deflecting and/or splitting the fluid jet. Advantageously, the deflector structure is formed by a wall opposite the point at which the focusing channel enters into the expansion chamber, or is an integrated part of the same.

According to the embodiment according to claim 20, the multitude of adjacent fluid channels, the inlet chamber into which the fluid channels enter, and the focusing channel fluidly connected to the inlet chamber each are provided twice or several times, and the two or several focusing channels enter into the one common expansion chamber. In this context, the focusing channels are advantageously arranged in such a way that they enter into the common expansion chamber so that the fluid jets collide in the expansion chamber, which further considerably heightens the mixing effect. The two or several multitudes of adjacent fluid channels, inlet chambers, and focusing channels are disposed spatially separately and only fluidly connected via the common expansion chamber. These structures may serve to supply the same fluids, as for example twice the fluids A, B, or differing fluids, as for example the fluids A, B, and C, D.

According to a preferred embodiment, the structures of the fluid channels, the inlet chamber, the focusing channel, and the expansion chamber are constructed as recesses and/or penetrations in a plate serving as mixing plate and manufactured of a material of sufficient inertness for the fluids to be mixed. These open structures are closed in by a cover and/or base plate fluidly tightly connected to the mixer plate, wherein the cover and/or base plate are equipped with supplying devices for the two fluids and/or at least one outlet for the resulting mixture. Recesses, such as grooves or pocket holes, are enveloped by material on a plane as well as perpendicular to the same. Penetrations, such as slots or holes, on the other hand, pierce the material, i.e. they are enveloped by the material only laterally on one plane. The recesses and penetrations are closed in by the cover or base plate, while fluid-conducting structures, such as channels and chambers, are formed. The supplying devices and/or outlets in the cover or base plate may be implemented in the form of grooves and/or bores.

Depending on the fluids used, different materials, such as polymer materials, metals, alloys, glass, in particular, photo-structurable glass, quartz glass, ceramic materials, or semi-conductor materials, such as silicon, may be considered as suitable materials. Plates with a thickness of 10 $\mu$m to 5 mm are preferred, while thicknesses of 50 $\mu$m to 1 mm are particularly preferred. Suitable procedures for fluidly connecting the plates tightly with one another are, for example, compression, use of seals, bonding, thermal or anodic bonding and/or diffusion welding.

If the static micromixer is equipped with additional focusing channels and expansion chambers, these are preferably disposed on the one mixer plate. However, it is also conceivable to construct these on one or several additional mixing plates fluidly connected to the first mixing plate and, if warranted, to additional mixing plates.

According to one variant of this preferred embodiment, the static micromixer is equipped with a distribution plate inserted between the mixer plate and the base plate, fluidly tightly connected to these two plates, and serving to separately supply the fluids from the supplying devices in the base plate to the fluid channels of the mixing plate. For this purpose, the distribution plate advantageously is equipped with a row of holes for each fluid to be supplied, with each hole exactly assigned to one fluid channel. In this way, for two fluids, the first row serves to supply the first fluid, while the second row serves to supply the second fluid.

Preferably, at least the mixing plate and the cover and/or base plate are manufactured of a transparent material, in particular, of glass or quartz glass. Particularly preferred is the use of photo-structurable glass which, when using a photo-lithographic procedure, permits precise microstructuring. If the static micromixer is also equipped with a distribution plate, this preferably is as well manufactured of transparent material of this type. A particular advantage in this context is the fact that the mixing process occurring in the static micromixer can be observed from the outside.

Known precision-mechanical and micro-technical production procedures may be considered as procedures for structuring the plates, such as laser ablation, spark-eroding, injection molding, stamping, or electro-deposition. Also suitable are LIGA procedures which include at least the steps of structuring with energy-rich radiation and electro-deposition as well as, if warranted, by molding.

The procedure according to the invention and the static micromixer are advantageously used for executing chemical reactions with two or more educts. For this purpose or for the above named applications, means for controlling the chemical reaction are advantageously integrated into the static micromixer, such as for example temperature or pressure sensors, flow meters, heating elements, or heat exchangers. In a static micromixer according to claim 20, these means may be disposed on the same mixing plate or plates or on the additional plates which are arranged above and/or below and functionally connected to the same. In order to execute heterogeneously catalyzed chemical reactions, the static micromixer may also be equipped with catalytic material.

BRIEF DESCRIPTION OF THE DRAWINGS

Below, embodiments of the static micromixer according to the invention are explained with reference to drawings.

They show:

FIG. 1b the mixing plate according to FIG. 1a, in a top view;

DETAILED DESCRIPTION OF THE INVENTION

Figure 1A:
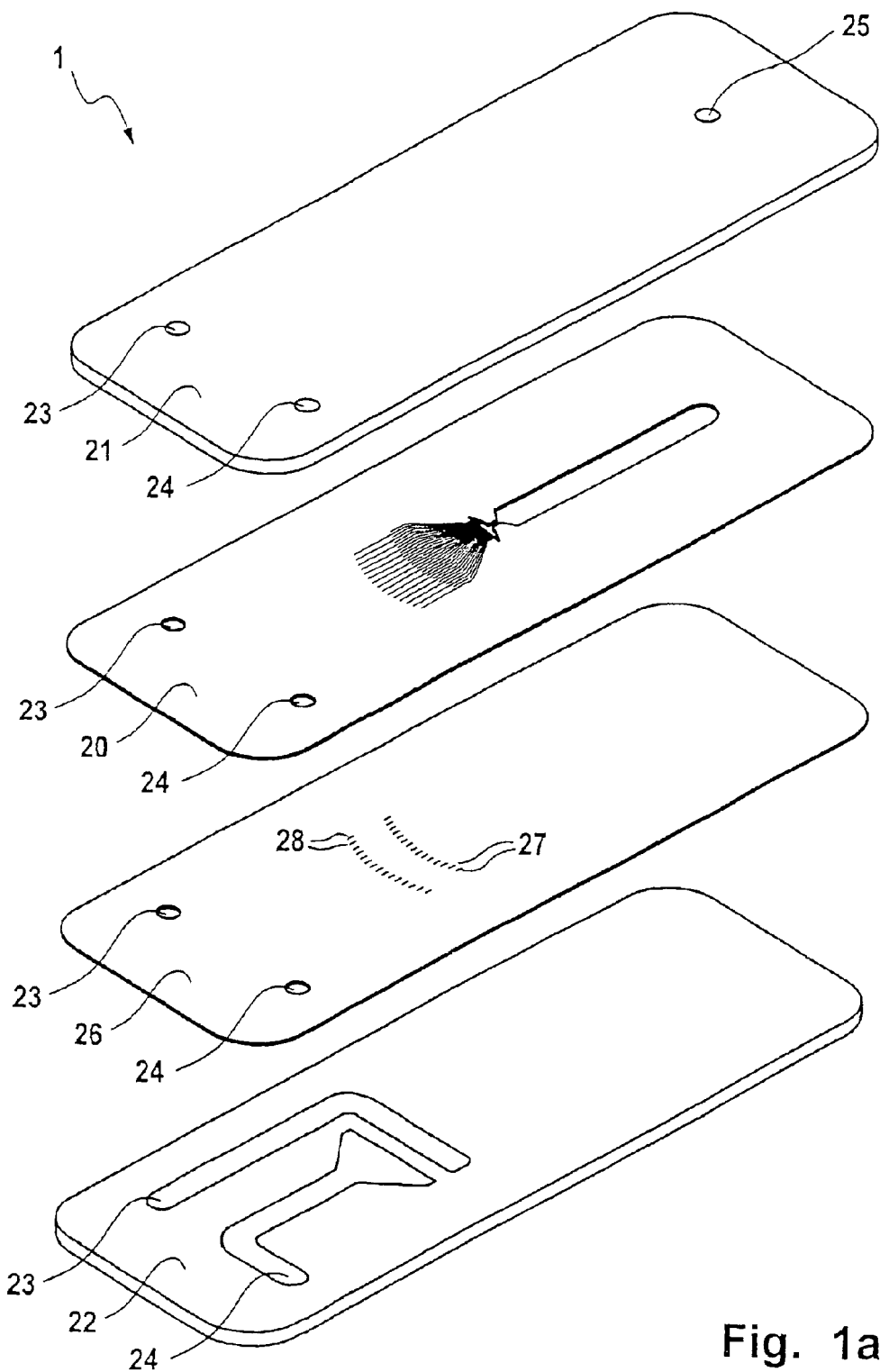
FIG. 1a a static micromixer comprising a cover plate, mixing plate, distribution plate, and base plate, each separated from the others, in perspective view.

FIG. 1a shows in perspective view a static micromixer 1 with a cover plate 21, a mixing plate 20, a distribution plate 26, and a base plate 22, each separate from the others.

The cover plate 21, the mixing plate 20, and the distribution plate 26 each are equipped with a supply line 23 for the fluid A and a supply line 24 for the fluid B in the shape of a bore. The bores are configured in such a way that when the plates are stacked one over the other, the supply lines 23, 24 are in fluid connection with the supply structures 23, 24 of the base plate 22. The supply line 23 for fluid A and the supply line 24 for fluid B are disposed on the base plate 22 in the form of grooves in such a way that fluid A can be supplied to the distribution structure 27, and fluid B to the distribution structure 28 of the distribution plate 26, located above, without substantial pressure loss. The distribution plate 26 is equipped with a distribution structure 27 for fluid A and a distribution structure 28 for fluid B, each in the form of a row of holes piercing the plate.

The mixing plate 20 shown in FIG. 1b in detail in a top view is equipped with fluid channels 2, 3, an inlet chamber 4, a focusing channel 5, and an expansion chamber 6. The outlet 25 in the form of a bore in the cover plate 21 is disposed in such a way that when the plates are stacked one over the other, the outlet 25 is fluidly connected to the expansion chamber 6 of the mixing plate 20. The channels 2 for fluid A have a shorter length than the channels 3 for fluid B. The sides of channels 2, 3 facing away from the inlet chamber 4 are running parallel to one another; while channels 2 for fluid A are running alternately adjacent to the channels 3 for fluid B. In a transitional area, the distance of the channels from one another diminishes in direction of the inlet chamber 4. In the area where the currents enter into the inlet chamber 4, the channels 2, 3 are again running parallel. In order to achieve an even volumetric flow rate over all channels 2, 3 for each individual fluid, the channels 2, 3 are constructed in equal length. This has the effect that those ends of the fluid channels 2, 3 which are distant from the inlet chamber 4 each form an arc. The bores of the distribution structures 27, 28 of the distribution plate 26 also each form an arc in such a way that the ends of the channels 2, 3 each make fluid contact with a bore. The inlet chamber 4 into which the fluid channels 2, 3 enter is constructed in semi-concave shape on the plane of the fluid channels. In the central area of the concave surface 8 located opposite the points at which the fluid channels 2, 3 enter, the inlet chamber 4 opens into the focusing channel 5. The focusing channel 5 enters into the expansion chamber 6 formed by a channel which in comparison to the focusing channel 5 is wider and extends in the same longitudinal direction. The structures of the fluid channels 2, 3, of the inlet chamber 4, of the focusing channel 5, and of the expansion chamber 6 are designed as penetrations piercing the material of the mixing plate 20. These structures, which are open on two sides, are covered by the distribution plate 26 located underneath and the cover plate 21 located above and form channels and/or chambers.

In the operational micromixer 1, the plates 21, 20, 26, and 22 which here are shown as separate are stacked on top of one another and fluidly connected tightly to one another, whereby the open structures, such as grooves 23, 24 and penetrations 2, 3, 4, 5, and 6, are covered while channels and chambers are being formed. The resulting stack made up of the plates 21, 20, 26, and 22 may be lodged in a mixing housing equipped with suitable fluid connections for the supply of two fluids and the removal of the fluid mixture. Furthermore, a compression force may be applied through the housing onto the stack of plates in order to provide a fluidly tight connection. It is also conceivable to operate the stack of plates as micromixer 1 without housing, for which purpose fluid connections, such as for example hose nozzles, are advantageously connected to the supply devices 23, 24 and the outlet 25 of the cover plate 21.

During the actual mixing process, a fluid A and a fluid B are fed into the supply bore 23 and into the supply bore 24, respectively, of the cover plate 21. These fluids flow through the supply structures 23 and 24, respectively, of the plates 20, 26, and 22 and from there are evenly distributed into the respective distribution structures 27 and 28 constructed as bores. From the bores of the distribution structure 27, fluid A flows into the channels 2 of the mixing plate 20 located exactly above the said distribution structure 27. Equally, fluid B flows from the bores of the distribution structure 28 into the channels 3 located exactly above the distribution structure 28. The fluid currents A, B flowing separately into the fluid channels 2, 3 are brought together in the inlet chamber 4 and form alternately adjacent fluid lamellae of the sequence ABAB. Due to the semi-concave shape of the inlet chamber 4, the combined fluid currents are quickly transferred into the focusing channel 5. The resulting focused total fluid current is fed into the expansion chamber 6 as fluid jet. The resulting mixture of the fluids A, B is drawn off through the outlet bore 25 of the cover plate 21 located above in the end area of the expansion chamber 6.

Figure 2:
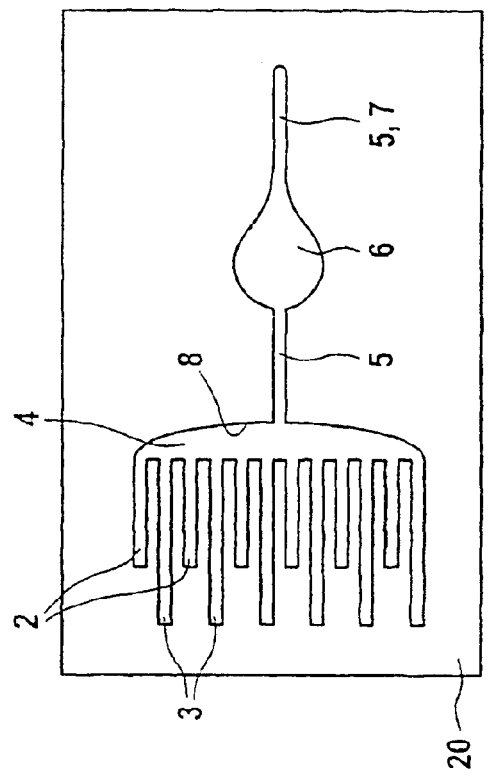
FIG. 2 a mixing plate with an outlet channel constructed as focusing channel, in a top view.

FIG. 2 shows a mixing plate 20 in a top view, wherein the supplying fluid channels 2, 3 for the fluids A and B are represented in simpler form than in FIG. 1b. The inlet chamber 4 is constructed in semi-concave shape, wherein the concave surface 8 is located opposite the areas in which the channels 2, 3 enter. In the central area of the concave surface 8, the inlet chamber 4 opens into the focusing channel 5. The focusing channel 5 is of equal width over its entire length and enters into the expansion chamber 6. On the side opposite the focusing channel 5, the expansion chamber 6 opens into an additional focusing channel 5' serving as outlet channel 7. In the top view, the expansion chamber 6 has an essentially circular shape which broadens toward the additional focusing channel 5'. Due to this construction, the interior of the expansion chamber 6 has on the plane shown a shape suitable for the generation of stationary vortices. Thereby, still water zones are avoided so that the fluid constantly flows through all areas of the expansion chamber 6.

The fluid currents of fluids A and B leaving channels 2, 3 are brought together in the inlet chamber 4 and, due to the semi-concave shape, are quickly transferred into the focusing channel 5 as combined fluid lamellae current. The substantially narrower cross section of the focusing channel 5 in comparison to the inlet chamber 4 causes the fluid current to be focused, i.e. it causes a reduction of the fluid lamellae width combined with a simultaneous increase of the flow velocity. The total fluid current focused in this way enters into the expansion chamber 6 as fluid jet 3 and there is laterally broadened, with the possibility of vortices being generated on both sides of the fluid jet. The mixed product obtained in the expansion chamber 6 is drawn off by the additional focusing channel 5' while again being focused. The obtained fluid mixture is drawn off at the end of the additional focusing channel 5' and upward into a cover plate located above the mixing plate 20.

Figure 3:
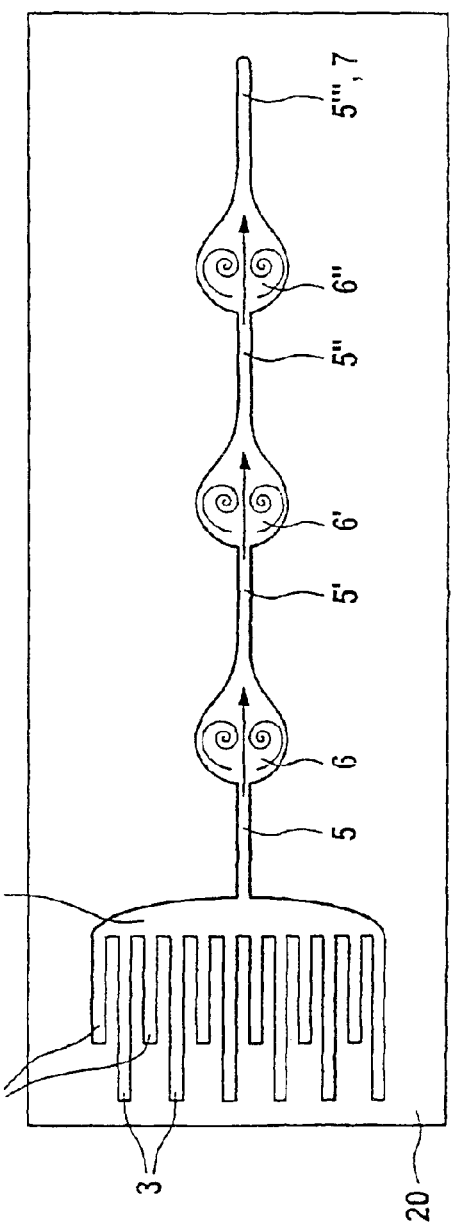
FIG. 3 a mixing plate with several focusing channels and expansion chambers disposed in series, in a top view.

The mixing plate 20 shown in FIG. 3 in a top view is equipped with a sequence of several expansion chambers 6, 6', 6" and focusing channels 5, 5', 5" all of which are arranged in series. The design and shape of the supplying fluid channels 2, 3, of the inlet chamber 4, of the focusing channel 5, and of the expansion chamber 6 are equal to those of the corresponding structures of the mixing plate shown previously in FIG. 2. Opposite the focusing channel 5, the expansion chamber 6 opens into an additional focusing channel 5' which runs in the same longitudinal direction as the focusing channel 5. This additional focusing channel 5' on its part enters into an additional swirl chamber 6' which in turn opens into an additional focusing channel 5'". This is followed by a third expansion chamber 6'" which then finally opens into the additional focusing channel 5'" serving as outlet channel 7. The focusing channels 5, 5', 5", 5'" are of essentially the same length and are arranged longitudinally in the same direction, with expansion chambers 6, 6', 6'" disposed between them. The direction of the fluid jet is indicated by arrows in the expansion chambers 6, 6', 6'''. Here, stationary vortices indicated by spiral-shaped lines are generated on both sides of the fluid jet. The focusing channel disposed behind an expansion chamber thus catches at least part of the fluid jet entering into the expansion chamber as well as part of the obtained mixed product. Thanks to the fact that the current is repeatedly focused and fed into an additional expansion chamber, mixtures, in particular emulsions and dispersions, of high quality can be obtained with brief mixing times.

Figure 4:
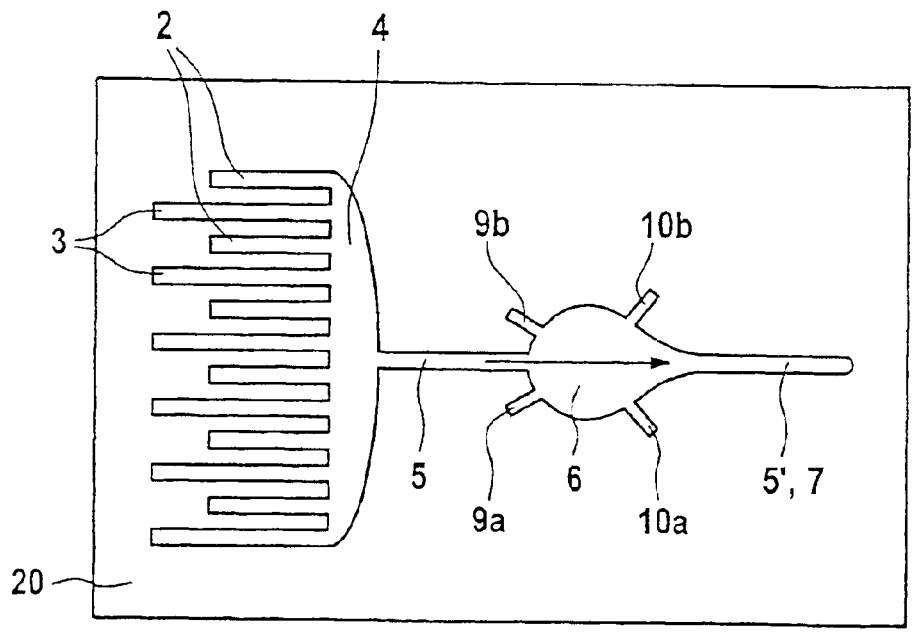
FIG. 4 a mixing plate with a mixing chamber with supply and outlet channels, in a top view.

In FIG. 4, the mixing plate 20 of an additional static micromixer according to the invention is shown in a top view. The design and configuration of the channels 2, 3, of the inlet chamber 4, of the focusing channel 5, of the expansion chamber 6, and of the additional focusing channel 5' serving as outlet 7 correspond to those of the structures represented in FIG. 2. Two supply channels 9a, 9b enter into the expansion chamber 6 on the side on which the focusing channel 5 enters and are arranged symmetrically to the same. These supply channels 9a, 9b can be used to feed an additional fluid, as for example an emulsifier, into the area of the generated vortices in the expansion chamber 6. Furthermore, two additional outlet channels 10a, 10b are connected to the expansion chamber 6, are located on the side where the expansion chamber 6 opens into the additional focusing channel 5', and are arranged symmetrically to the additional focusing channel 5'. These additional outlet channels 10a, 10b can be used to draw part of the resulting mixture out of the expansion chamber 6. For this purpose, the supply channels 9a, 9b and the additional outlet channels 10a, 10b are fluidly connected to corresponding supply or outlet structures in the cover plate above and/or the base plate. The configuration of the supply channels 9a, 9b and the additional outlet channels 10a, 10b here is only shown in exemplary fashion. In this way, corresponding supply and/or outlet channels may also be located in the area of the base plate and/or cover plate below and above the expansion chamber 6, respectively. Depending on the application, it may be advantageous if only one or several supply channels or only one or several outlet channels enter into the expansion chamber 6.

Figure 5:
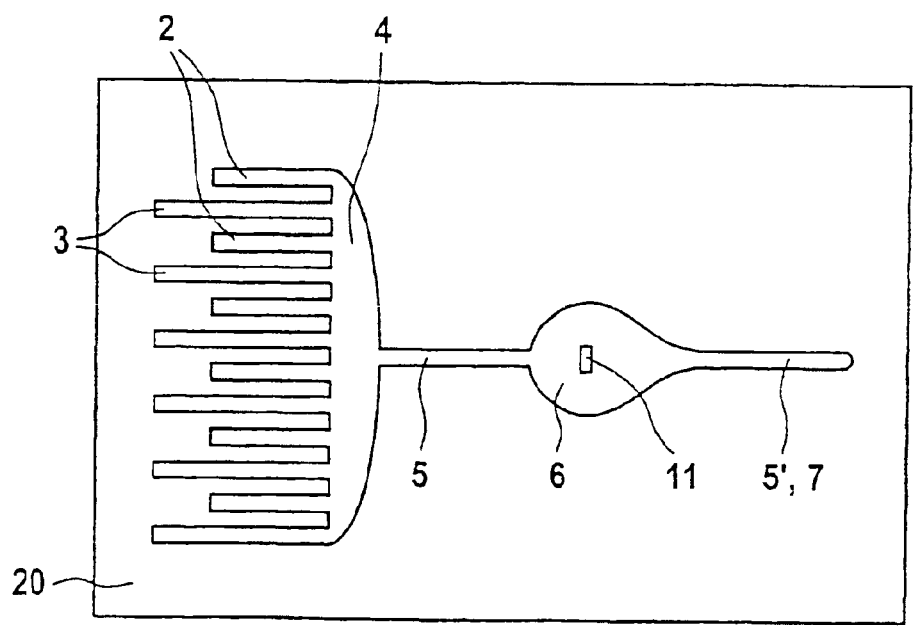
FIG. 5 a mixing plate with a deflector structure disposed in the expansion chamber, in a top view.

FIG. 5 shows in a top view a mixing plate 20 of a further static micromixer according to the invention with structures as shown in FIG. 2, wherein the expansion chamber 6, in addition, contains a deflector structure 11. The deflector structure 11 is formed by a cuboid structure where one surface of the cuboid is located opposite to and at a distance from the point at which the focusing channel 5 enters. This has the effect that the focused total fluid current entering into the expansion chamber 6 hits the deflector structure 11 and is deflected from there into the expansion chamber 6 while vortices are generated on both sides. In this way, a particularly intensive mixing process is achieved with very brief mixing times. The resulting mixture is drawn off through the additional focusing channel 5' serving as outlet channel 7.

Figure 6:
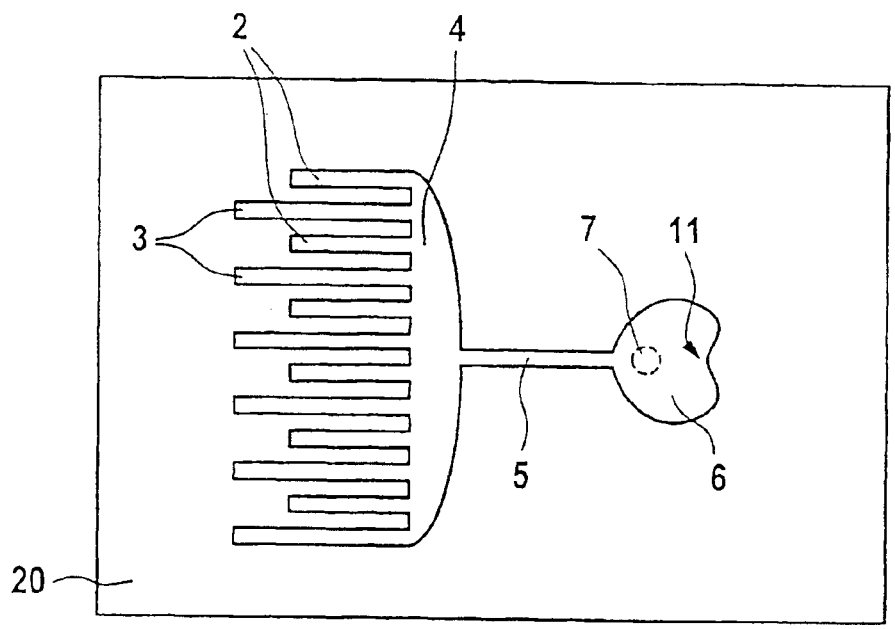
FIG. 6 a mixing plate with a deflector structure formed by the wall of the mixing chamber, in a top view.

A mixing plate 20 of a further embodiment of the static micromixer according to the invention is shown in FIG. 6 in a top view. The configuration of the fluid channels 2, 3, of the inlet chamber 4, and of the focusing channel 5 corresponds to that represented in FIG. 2. The focusing channel 5 opens into an expansion chamber 6 which has no outlet channel on the plane shown. On the plane shown, the expansion chamber 6 has an essentially round shape, wherein the surface opposite the focusing channel 5 is curved inward into the expansion chamber. This has the effect that the fluid jet moving from the focusing channel 5 into the expansion chamber 6 hits the curved part of the surface serving as deflector structure 11 and is deflected on both sides into the expansion chamber 6. The resulting mixture is drawn off through an outlet channel 7 located in the cover plate not shown here and indicated by a circular dotted line.

Figure 7:
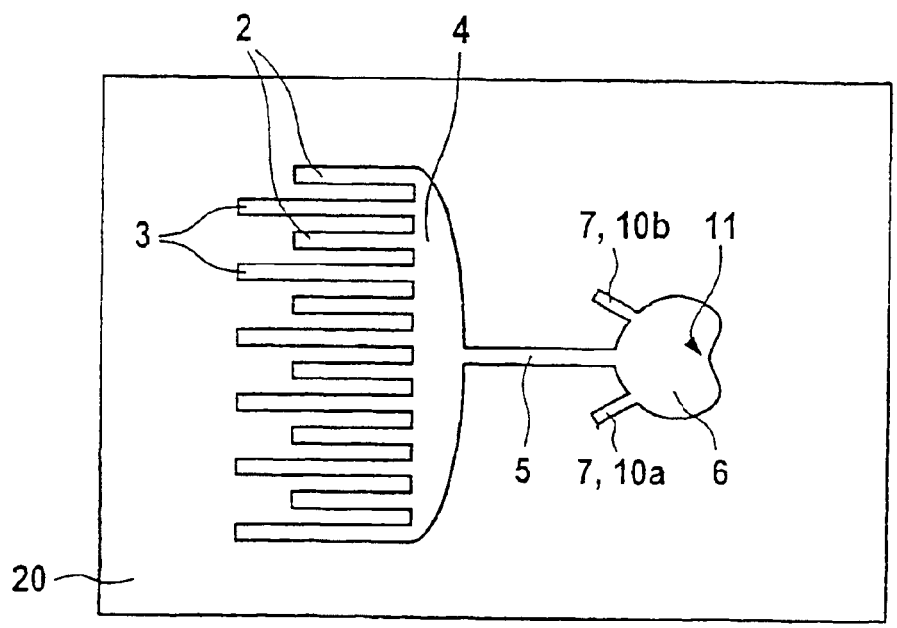
FIG. 7 a mixing plate according to FIG. 6, but with outlet channels disposed laterally, in a top view.

FIG. 7 shows a variant of the embodiment of the mixing plate 20 of the static micromixer represented in FIG. 6. Here as well, a deflector structure 11 is formed by an area of the wall of the expansion chamber 6 which is curved inward into the expansion chamber 6. Two outlet channels 10a, 10b enter the expansion chamber 6. These outlet channels are disposed essentially opposite the deflector structure 11 and symmetrically to the axis of the focusing channel 5. In comparison to FIG. 6, the obtained mixture is therefore not drawn off upward out of the expansion chamber, but rather laterally from the areas of vortex generation.

Figure 8:
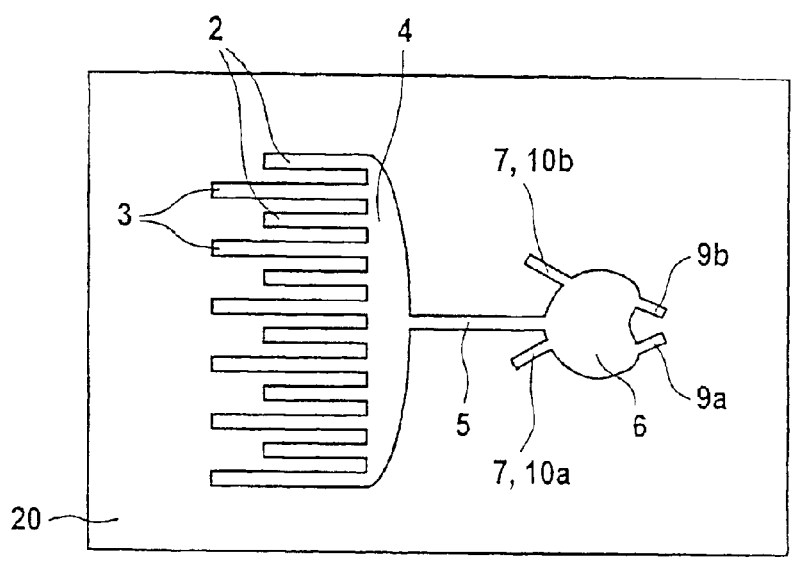
FIG. 8 a mixing plate according to FIG. 7 with additional supply channels, in a top view.

FIG. 8 represents a variant of the embodiment shown in FIG. 7. In addition to the additional outlet channels 10a, 10b, two supply channels 9a, 9b enter the expansion chamber 6. The supply channels are disposed on both sides of the deflector structure 11 and adjoining the same as well as symmetrically to the axis formed by the focusing channel 5. As also described with reference to FIG. 4, these supply channels can serve to supply a fluid supporting the mixture, in particular, the emulsion or dispersion, such as for example to supply an emulsifier. The additional outlet channels 10a, 10b and the supply channels 9a, 9b are fluidly connected to corresponding supply and outlet structures, respectively, in the base and/or the cover plate.

Figure 9:
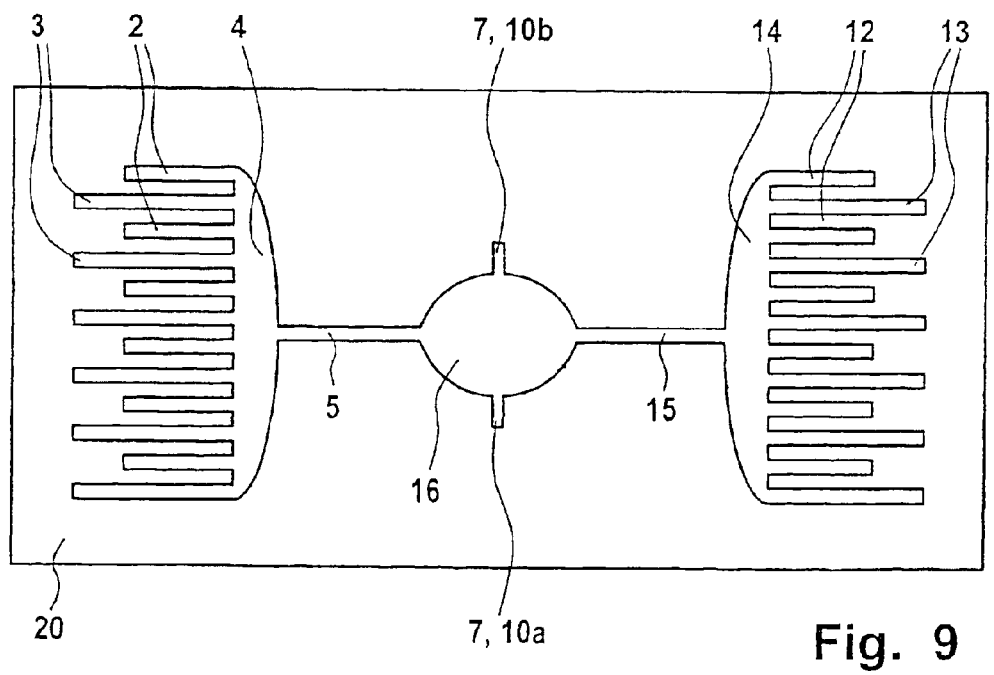
FIG. 9 a mixing plate with two focusing channels disposed opposite of one another and entering into a common expansion chamber, in a top view.

A mixing plate 20 of a further embodiment of the static micromixer is shown in FIG. 9 in a top view. From two opposite sides, two focusing channels 5, 15 enter into a common expansion chamber 16. The focusing channels 5, 15 are connected to an inlet chamber 4, 14, respectively, into which enter the fluid channels 2, 3; 12, 13. The two focusing channels 5, 15 are running longitudinally in the same direction. One outlet channel 10a, 10b enters on either side into the expansion chamber 16 on the same plane as and perpendicular to the focusing channels 5, 15. The fluid currents leaving the fluid channels 2, 3; 12, 13 are combined in the inlet chamber 4 as well as in the inlet chamber 14, then quickly fed into the focusing channel 5, 15 and focused. The fluid lamellae currents thus combined and focused leave the focusing channels 5, 15 as fluid jets, enter the common expansion chamber 16 from opposite sides, and collide while generating vortices, which causes an intensive mixture to be achieved within extremely short time. The obtained mixed product is drawn out of the common expansion chamber 16 on either side through the outlet channels 10a, 10b which are fluidly connected to corresponding structures in the base and/or cover plate.

Embodiment

Micro-structured glass plates were used to execute the static micromixer represented in FIGS. 1a and 1b. The mixing plate 20 and the distribution plate 26 each had a thickness of 150 $\mu$m while the closing base plate 22 and cover plate 21 each had a thickness of 1 mm. Bores with a diameter of 1.6 mm were chosen for supply to structures 23, 24 in the cover plate 21, the mixing plate 20, and the distribution plate 26. The distribution plate 26 was equipped with two rows of each 15 long holes of a length of 0.6 mm and a width of 0.2 mm as distribution structures 27, 28. The fluid channels 2, 3 of the mixing plate 20 had a width of 60 $\mu$m and a length of 11.3 mm or a length of 7.3 mm, respectively.

In the area where the channels 2, 3 enter into the inlet chamber 4, the segments located between the channels 2, 3 had a width of 50 μm. The inlet chamber 4 had a width of 4.3 mm in the area where the fluid channels 2, 3 enter and at the opposite side, the width of the focusing channel of 0.5 mm. Since all structures of the mixing plate 20 were constructed as penetrations, the fluid channels 2, 3, the inlet chamber 4, the focusing channel 5, and the expansion chamber 6 all have a depth equal to the thickness of the mixing plate of 150 μm. The length of the inlet chamber 4, i.e. the distance between the points where the fluid channels 2, 3 enter and the point where the focusing channel 5 enters, was only 2.5 mm, in order to permit the combined fluid currents to be drawn off and focused quickly. The ratio between the cross section of the focusing channel and the sum of the cross sections of the fluid channels 2, 3 therefore was 1 to 3.6. With the focusing channel 5 having a length of 2.5 mm, a ratio between length and width of 5 to 1 was obtained. The focusing channel 5 opened in longitudinal direction into the expansion chamber 6 constructed similar to a channel with a length of 24.6 mm and a width of 2.8 mm. The opening angle of the side walls of the expansion chambers 6 in the transitional area between the expansion chamber 6 and the focusing channel 5 amounted to 126.7°. The four plates shown in FIG. 1a had outer dimensions of 26×76 mm. The plates were structured by photo-lithography using photo-structurable glass in a known process as described by Th. R. Dietrich, W. Ehrfeld, M. Lacher, and B. Speit in Microstrukturprodukte aus fotostrukturierbarem Glas [Microstructured Products made of Photo-Structurable Glass], F&M 104 (1996), pages 520 to 524. The plates were fluidly tightly connected by thermal bonding.

The fact that all components of the static micromixer were manufactured of glass made it possible to observe the mixing process under a light-optical microscope, as shown by the respective images of the FIGS. 10a, 10b, and 10c under illumination from below.

For this purpose, the process of generating emulsions using silicon oil with water containing a blue dye was investigated. FIGS. 10a through 10c show only the section of the areas where the fluid channels 2, 3 enter into the inlet chamber 4, the focusing channel 5, and the expansion chamber 6.

The fluid channels carrying the water treated with the blue dye can be clearly recognized by their darker gray shade in the left area where the fluid channels enter the inlet chamber. Since the supplied silicon oil as well as the segments manufactured of glass which are located between the fluid channels 2, 3 are transparent, they cannot be differentiated here.

In all three images, the processes of bringing the separate fluid currents together and of drawing off the combined fluid currents while focusing them can be clearly detected. The fluid lamellae structure remains intact during these processes.

Figure 10A:
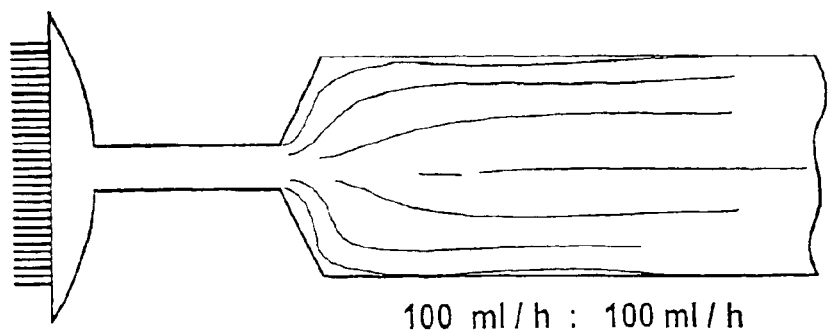
FIG. 10a a light-microscopy image of a static micromixer according to FIG. 1a during the mixing process of a dyed and a colorless liquid at a volumetric flow rate of each 100 ml/h.

In FIG. 10a which was taken for each silicon oil and water with a volumetric flow rate of 100 ml/h, fast broadening of the total fluid current at the time of entry into the expansion chamber can be detected.

Figure 10B:
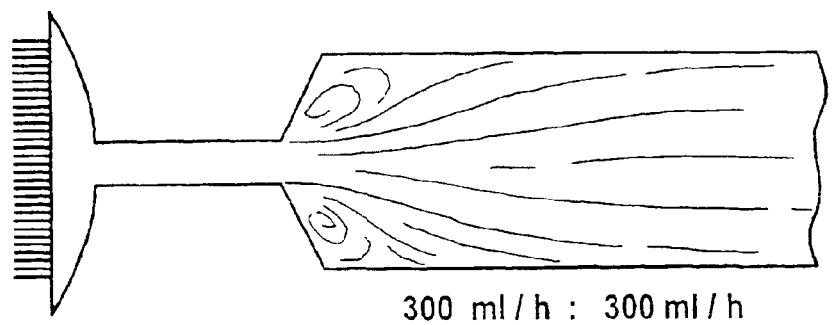
FIG. 10b an image as in FIG. 10a, but at 300 ml/h.

In FIG. 10b which was taken with volumetric flow rates of each 300 ml/h, the formation of a fluid jet at the time of entry into the expansion chamber can be clearly detected, while the fluid jet later fans out. Vortices are generated on both sides of the fluid jet in the expansion chamber.

Figure 10C:
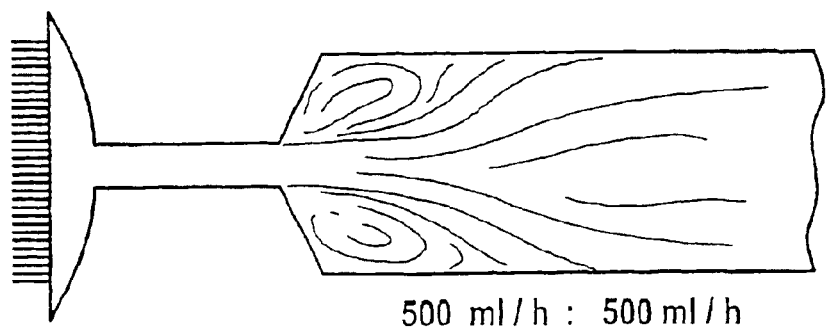
FIG. 10c an image as in FIG. 10a, but at 500 ml h.

The clearest view of the generation of stationary vortices on both sides of the fluid jet entering into the expansion chamber 6 is gained from FIG. 10c which was taken with volumetric flow rates of each 500 ml/h.

| List of Drawing References | |
|---|---|
| 1 | static micromixer |
| 2 | fluid channel for fluid a |
| 3 | fluid channel for fluid b |
| 4 | inlet chamber |
| 5 | focusing channel |
| 5', 5", . . . | additional focusing channel |
| 6 | expansion chamber |
| 6', 6", . . . | additional expansion chamber |
| 7 | outlet channel |
| 8 | concave surface |
| 9a, 9b | supply channel |
| 10a, 10b | additional outlet channels |
| 11 | deflector structure |
| 12 | fluid channel for fluid a |
| 13 | fluid channel for fluid b |
| 14 | inlet chamber |
| 15 | focusing channel |
| 16 | common expansion chamber |
| 20 | mixing plate |
| 21 | cover plate |
| 22 | base plate |
| 23 | supply device for fluid a |
| 24 | supply device for fluid b |
| 25 | outlet |
| 26 | distribution plate |
| 27 | distribution structure for fluid a |
| 28 | distribution structure for fluid b |

What is claimed is:

1. A procedure for mixing at least two fluids, comprising the following steps:

bringing together a multitude of separate fluid currents of the two fluids, each of a width in the range of 1 μm to 1 mm and a depth in the range of 1 0 μm to 10 mm and alternately adjacent fluid lamellae of the two fluids are generated;

carrying away the combined fluid currents and a focused total fluid current is generated;

wherein:

the focused total fluid current is fed as fluid jet into an expansion chamber with a larger cross section than the focused total fluid current perpendicular to the flow direction of the focused total fluid current; and the resulting mixture is drawn off.

2. A procedure according to claim 1, wherein the combined fluid currents are focused in such a way that the ratio of the cross section of the focused total fluid current and the sum of the cross sections of the fluid currents to be combined, all perpendicular to the flow direction, is in the range of 1:1.5 to 1:500, preferably in the range of 1:2 to 1:50.

3. A procedure according to claim 1, wherein the ratio of the length of the focused total fluid current and its width is in the range of 1:1 to 30:1, preferably in the range of 1.5:1 to 10:1.

4. A procedure according to claim 1, wherein the focused total fluid current enters the expansion chamber as fluid jet in such a way that stationary vortices are generated on both sides of the fluid jet on at least one plane.

5. A procedure according to claim 1, wherein after having been fed into the expansion chamber, at least part of the fluid current is drawn off while again being focused.

6. A procedure according to claim 1, wherein the following two steps are executed once or in several repetitions:

after previously being fed into the expansion chamber, at least part of the fluid current is carried away and forms a focused fluid current;

the focused fluid current is fed into an additional expansion chamber having a larger cross section than the focused fluid current perpendicular to the flow direction of the focused fluid current;

wherein the resulting mixture is drawn off after the last step.

7. A procedure according to claim 1, wherein an additional fluid, as for example a fluid containing an additive for stabilizing the mixture, is fed into the expansion chamber.

8. A procedure according to claim 1, wherein at least part of the resulting mixture is drawn off the area or areas of the expansion chamber with vortices being generated.

9. A procedure according to claim 1, wherein the first two steps are each executed two or several times, simultaneously and spatially separately, and that the resulting two or more focused total fluid currents are fed into the common expansion chamber.

10. A static micromixer for mixing at least two fluids, comprising: a multitude of alternately adjacent fluid channels of a width in the range of 1 μm to 1 mm and a depth in the range of 10 μm to 10 mm for separately supplying the fluids as fluid currents;

an inlet chamber into which the fluid channels enter;

a focusing channel fluidly connected to the inlet chamber for carrying away the fluid currents combined in the inlet chamber and generating a focused total fluid current;

an expansion chamber into which the focusing channel enters and into which the focused total fluid current runs as fluid jet, with a larger cross section than the focusing channel perpendicular to the axis of the focusing channel; and at least one outlet channel fluidly connected to the expansion chamber for drawing off the resulting mixture.

11. A static micromixer according to claim 10, wherein in its interior the inlet chamber has a concave or semi-concave shape on at least one plane, wherein the concave surface into the center of which the focusing channel runs is located opposite the surface into which the fluid channels enter.

12. A static micromixer according to claim 10, wherein the ratio between the cross section of the focusing channel and the sum of the cross sections of the fluid channels entering into the inlet chamber, always perpendicular to the channel axis, is in the range of 1:1.5 to 1:500, preferably in the range of 1:2 to 1:50.

13. A static micromixer according to claim 10, wherein the ratio between the length of the focusing channel and its width is in the range of 1:1 to 30:1, preferably in the range of 1.5:1 to 10:1.

14. A static micromixer according to claim 10, wherein the ratio between the cross section of the expansion chamber and the cross section of the focusing channel entering into the expansion chamber, in at least a central area, perpendicular to the channel axis is in the range of 1.5:1 to 500:1, preferably in the range of 2:1 to 50:1.

15. A static micromixer according to claim 10, wherein the expansion chamber opens into an additional focusing channel serving as outlet channel for drawing off and re-focusing at least part of the total fluid current.

16. A static micromixer according to claim 10, wherein a sequence of one or several additional focusing channels into which open the respective upstream expansion chambers for drawing off and focusing at least part of the total fluid current, and one or several additional expansion chambers into which the respective upstream additional focusing channels enter, and with at least one outlet channel fluidly connected to the last expansion chamber in the sequence for drawing off the resulting mixture.

17. A static micromixer according to claim 10, wherein one or several supply channels enter into the expansion chamber for supplying an additional fluid, such as for example a fluid containing an additive for stabilizing the mixture.

18. A static micromixer according to claim 10, wherein one or several additional outlet channels are connected to the expansion chamber for drawing off the resulting mixture.

19. A static micromixer according to claim 10, wherein a deflector structure is disposed in the expansion chamber for the purpose of deflecting the fluid jet.

20. A static micromixer according to claim 10, wherein the multitude of adjacent fluid channels, the inlet chamber into which the fluid channels enter, and the focusing channel fluidly connected to the inlet chamber each are provided two or several times and that the two or more focusing channels enter into a common expansion chamber.

21. A static micromixer according to claim 10, wherein the structures of the fluid channels, of the inlet chamber, of the focusing channel, and of the expansion chamber are constructed as recesses, or penetrations, or a combination thereof; in a plate serving as mixing plate and manufactured of a material sufficiently inert for the fluids to be mixed, and that these open structures are closed in by a cover, or base plate or a combination thereof; fluidly connected to the mixing plate, wherein the cover, or base plate, or a combination thereof; are equipped with supply devices for the two fluids, or at least one outlet, or a combination thereof, for the resulting mixture.

22. A static micromixer according to claim 21, wherein a distribution plate located between the mixing plate and the base plate, fluidly tightly connected to the same and serving the purpose of separately supplying the fluids from the supply devices in the base plate to the fluid channels in the mixing plate.

23. A static micromixer according to claim 21, wherein at least the mixing plate and the cover, or base plate, or a combination thereof, are manufactured from a transparent material, in particular, glass or quartz glass.

* * * * *